(12) United States Patent
Fujimura et al.

(10) Patent No.: US 10,355,442 B2
(45) Date of Patent: Jul. 16, 2019

(54) SEMICONDUCTOR OPTICAL MODULE PROVIDING CARRIER WITH STRUCTURE FOR RECEIVING EXCESS SOLDER

(71) Applicant: Sumitomo Electric Industries, Ltd., Osaka-shi (JP)

(72) Inventors: Yasushi Fujimura, Osaka (JP); Taichi Misawa, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/045,894

(22) Filed: Jul. 26, 2018

(65) Prior Publication Data

US 2019/0036298 A1 Jan. 31, 2019

(30) Foreign Application Priority Data

Jul. 26, 2017 (JP) .................................. 2017-144447

(51) Int. Cl.
*H01S 5/022* (2006.01)
*H01S 5/024* (2006.01)
*H01L 23/00* (2006.01)
*H01S 5/40* (2006.01)

(52) U.S. Cl.
CPC .......... *H01S 5/02272* (2013.01); *H01L 24/00* (2013.01); *H01S 5/02208* (2013.01); *H01S 5/02236* (2013.01); *H01S 5/02248* (2013.01); *H01S 5/02276* (2013.01); *H01S 5/02415* (2013.01); *H01S 5/4025* (2013.01)

(58) Field of Classification Search
CPC ............. H01S 5/02272; H01S 5/02256; H01S 5/02208; H01S 5/02248; H01S 5/02415; H01S 5/02276
See application file for complete search history.

(56) References Cited

U.S. PATENT DOCUMENTS

| 2003/0180010 | A1 | 9/2003 | Minamino et al. |
| 2007/0206649 | A1* | 9/2007 | Xu ...................... H01S 5/02212 372/38.02 |
| 2011/0235980 | A1* | 9/2011 | Sato ..................... G02B 6/4206 385/93 |
| 2015/0132001 | A1 | 5/2015 | Sato |

FOREIGN PATENT DOCUMENTS

| JP | H7-030013 A | 1/1995 |
| JP | H8-316682 A | 11/1996 |
| JP | 2001-223425 A | 8/2001 |
| JP | 2003-273436 A | 9/2003 |
| JP | 2003-273438 A | 9/2003 |
| JP | 2015-095471 A | 5/2015 |

* cited by examiner

*Primary Examiner* — Armando Rodriguez
(74) *Attorney, Agent, or Firm* — Baker Botts L.L.P.; Michael A. Sartori

(57) ABSTRACT

An optical module that includes at least one semiconductor optical device, a carrier, a housing, and eutectic alloy that fixes the carrier to the housing is disclosed. The carrier mounts a component that couples with the semiconductor optical device. The housing, which includes a side wall made of ceramics and a base made of metal to form a space that encloses the semiconductor optical device, the carrier, and the component therein. The carrier provides a room facing the base and the side wall, where the room receives excess eutectic alloy oozing out from a gap between the carrier and the base.

13 Claims, 8 Drawing Sheets

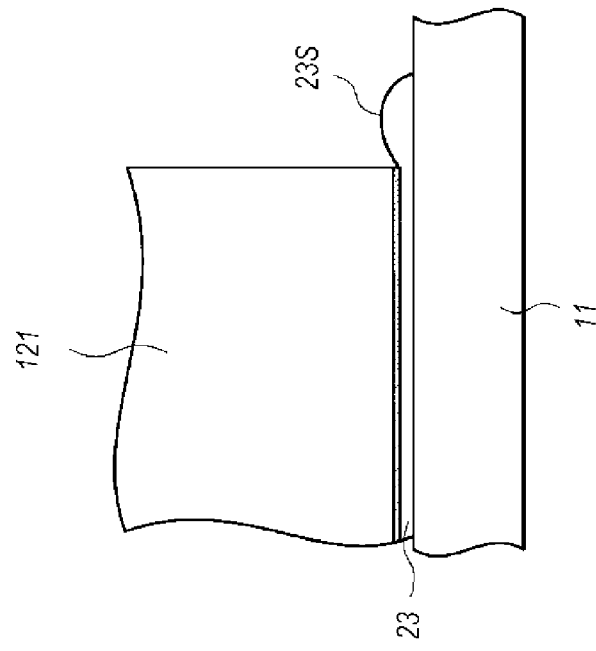
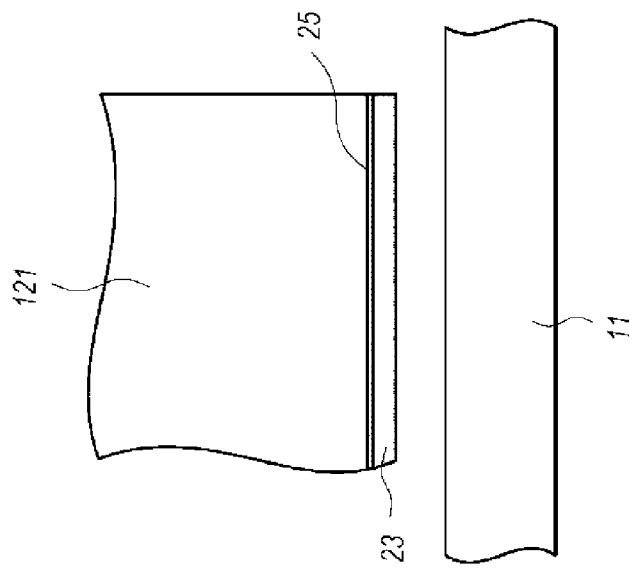

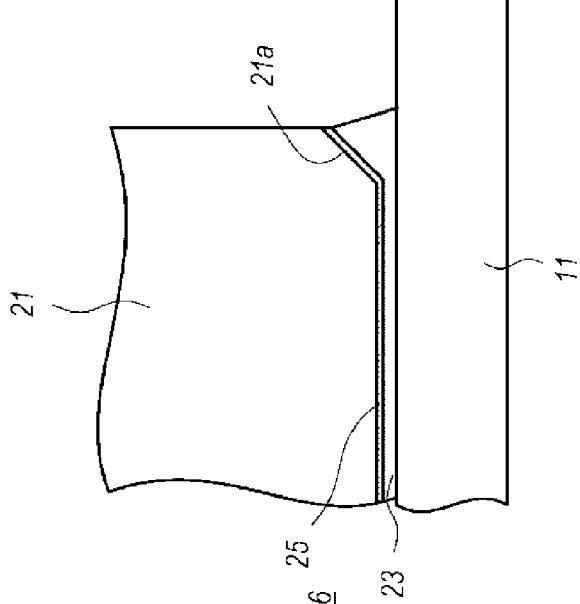
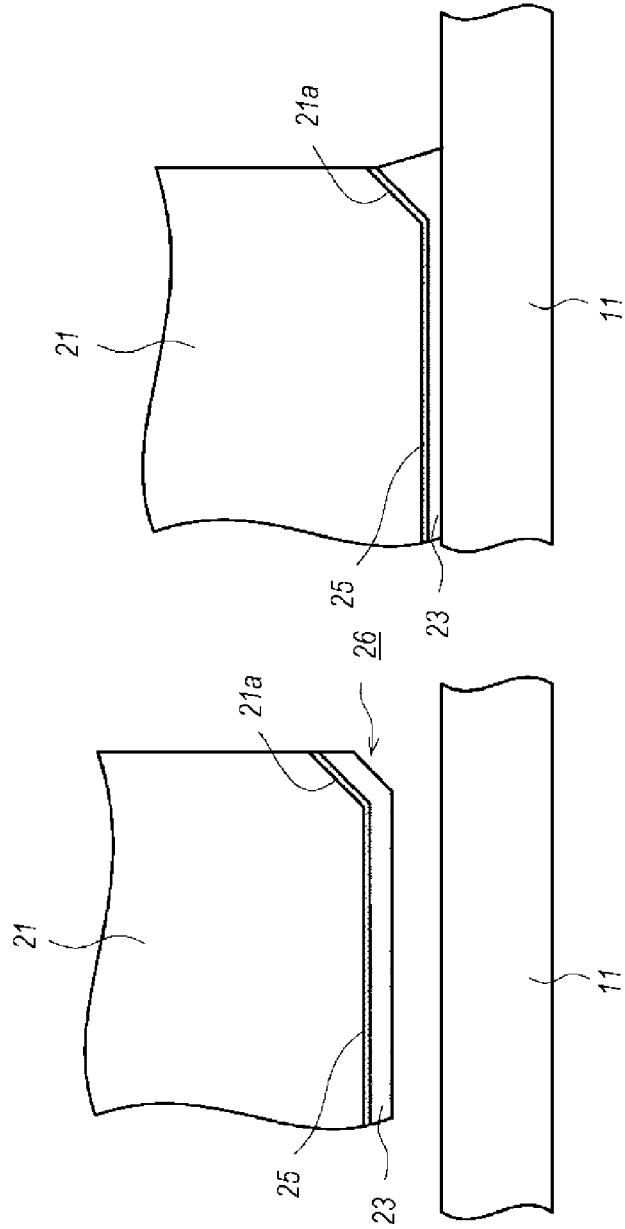

SEMICONDUCTOR OPTICAL MODULE PROVIDING CARRIER WITH STRUCTURE FOR RECEIVING EXCESS SOLDER

CROSS REFERENCE TO RELATED APPLICATION

The present application is based on and claims the benefit of priority of Japanese Patent Application No. 2017-144447, filed on Jul. 26, 2017, the entire content of which is incorporated herein by reference.

BACKGROUND OF INVENTION

1. Field of Invention

The present invention relates to a semiconductor optical module that proves a carrier for mounting a component. In particular, the carrier of the present invention provides a structure for receiving excess solder that fixed the carrier.

2. Background Art

A request for making an optical module and an optical sub-assembly (OSA) installed therein smaller is continuously and eagerly raised as a volume of information to be transmitted explosively increases. This inevitably results in enhanced packing density for optical and/or electrical components enclosed within an optical module and an optical sub-assembly, which means that spaces or distances between components on a substrate that assembles the components thereon become narrower and narrower.

A Japanese Patent Application laid open No. JP2015-095471A has disclosed an optical transmitting module implementing four laser diodes (LDs), a driver for driving the LDs, four photodiodes (PDs) for sensing strengths of optical signals output from the LDs, an optical multiplexer, and a thermistor on a single thermo-electric cooler (TEC). In order to keep wavelengths of the optical signals in constant, the LDs are necessary to be precisely controlled in temperatures thereof. Accordingly, electronic circuits for driving the TEC become larger. Moreover, in order to drive the LDs in high speed, the driver also becomes larger. However, contrary to those backgrounds, the continuous request described above has still kept the subject that the optical module must be formed in slim.

SUMMARY OF INVENTION

An aspect of the present invention relates to an optical module that includes at least one semiconductor optical device, a carrier, a housing, and a eutectic alloy that fixes the carrier to the housing. The carrier mounts a component coupling with the semiconductor optical device. The housing of the present invention includes a side wall and a base. The side wall is made of multi-layered ceramics, while, the base is made of metal. The side wall and the base forms a space into which the at least one semiconductor optical device and the carrier with the component are enclosed. A feature of the present invention is that the carrier provides a room in a corner facing the base and the side wall where the room may receive excess eutectic alloy that oozes out from a gap between the carrier and the base.

BRIEF DESCRIPTION OF THE DRAWINGS

The invention may be more completely understood in consideration of the following detailed description of various embodiments of the invention in connection with the accompanying drawings, in which:

FIG. 5A and FIG. 5B show processes of mounting the conventional carrier onto the base;

FIG. 6A and FIG. 6B show processes of mounting the carrier of the present embodiment onto the base;

DESCRIPTION OF EMBODIMENTS

Some embodiments of a carrier according to the present invention, which is installed within an optical transmitting module, will be described referring to accompanying drawings. The present invention, however, in a scope thereof is not restricted to those embodiments; and includes all modifications and changes within scopes defined in claims attached hereto. Also, the present invention may include all combinations of any embodiments as long as the embodiments may be combined to each other. In the description below, numerals or symbols same with or similar to each other will refer to elements same with or similar to each other without duplicating explanations.

Figure 1:
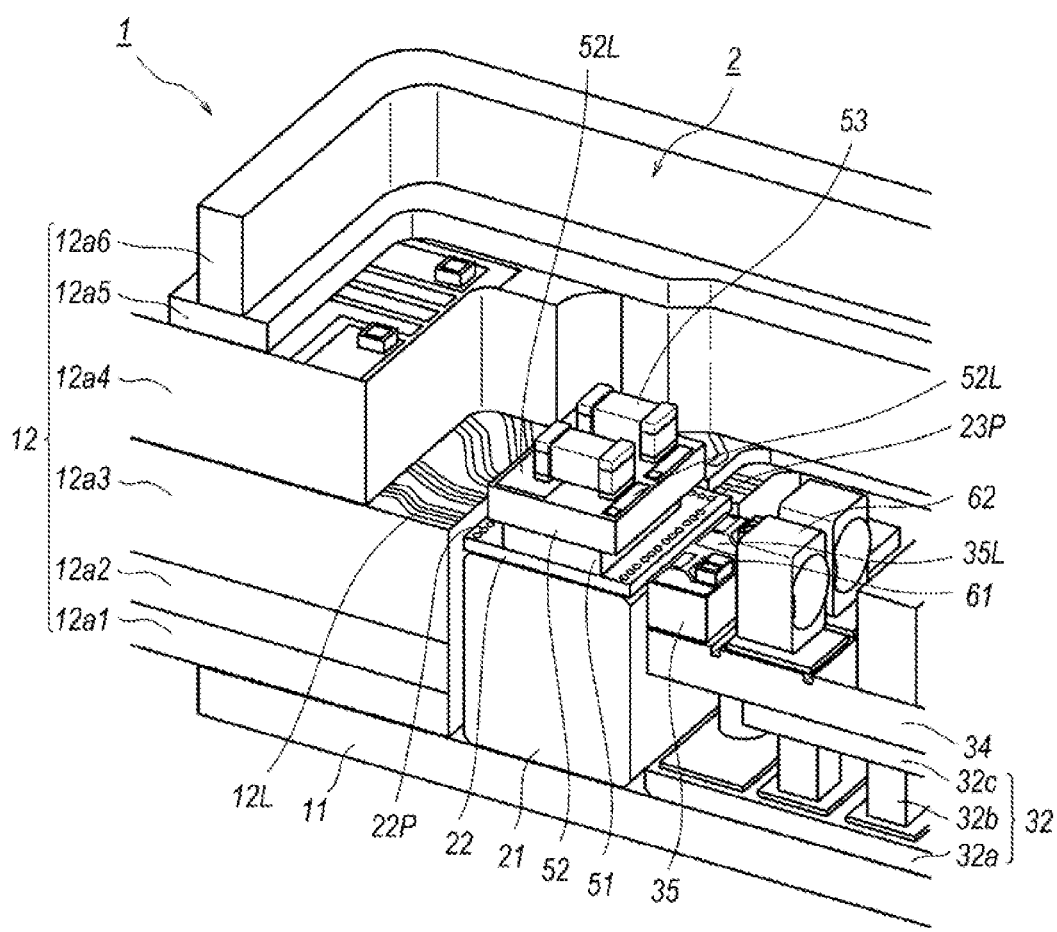
FIG. 1 is a perspective view of a cross section showing an inside of an optical transmitting module according to an embodiment of the present invention.
Figure 2:
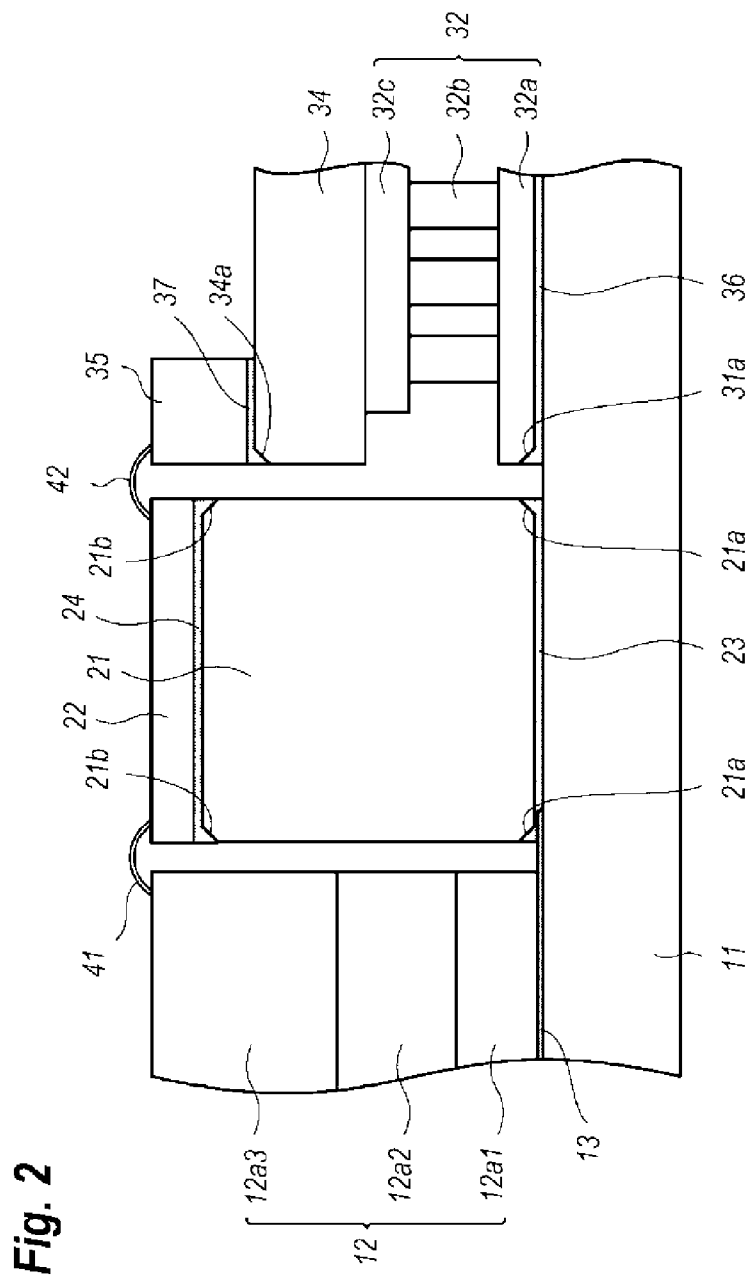
FIG. 2 shows a cross section of a primary portion of the optical transmitting module around the carrier.

FIG. 1 is a perspective view of a cross section showing an inside of an optical transmitting module according to an embodiment of the present invention, where the optical transmitting module 1 provides a carrier 21 that mount a driver 22 and electronic components thereon; while, FIG. 2 shows a cross section of a primary portion within the optical transmitting module 1 around the carrier 21. FIG. 1 omits bonding wires connecting between components and solder. The optical transmitting module 1 provides a box-shaped housing 2 that attaches an optical coupling portion in one side, which is not illustrated in FIG. 1 but locates in a right hand side in FIG. 1, and a feedthrough in another side opposite to the former side.

Installed within the housing 2 are a plurality of laser diodes (LDs) 61, specifically four LDs in the present embodiment, a driver 22 that electrically drives the four LDs 61, a plurality of inductors 53, a plurality of PDs, which are not illustrated in FIG. 1, for sensing intensities of optical signals output from the LDs 61, optical components such as lenses 62, a thermo-electric cooler (TEC) 32, a thermistor that is also omitted in the figures. The inductors 53 and the PDs are provided corresponding to respective LDs 61, that is, the present embodiment provides four PDs and four inductors 53.

The housing 2 includes a base 11, which may be made of material having substantial thermal conductivity, typically a sintered material of copper and tungsten (CuW), and a side wall made of multi-layered ceramics 12. The side wall 12 includes a plurality of layers, 12a1 to 12a6, each made of ceramics, where the present embodiment provides six (6)

layers, two of which stacked intermediately, 12a3 and 12a4, provide interconnections on respective top surfaces, while lower four layers, 12a1 to 12a4, including the two intermediate layers, 12a3 and 12a4, constitute the feedthrough. Vias are provided in the two intermediate ceramic layers, 12a3 and 12a4, which pierce respective layers, 12a3 and 12a4, for electrically connecting the interconnections. The interconnections are connected with circuits implemented within the housing 2, and exposed outside of the housing 2 that operate as signal terminals and bias terminals. The base 11 mounts the carrier 21 thereon within the housing 2, and the carrier 21 mounts the driver 22 thereon. The carrier 21 is soldered with the base 11 by a eutectic solder of gold and tin (AuSn); while, the TEC 32 in a bottom plate 32a thereof is soldered with the base 11 by leadfree solder whose melting point is lower than that of AuSn eutectic solder, for instance, tin-silver-cupper (SnAgCu).

Figure 3:
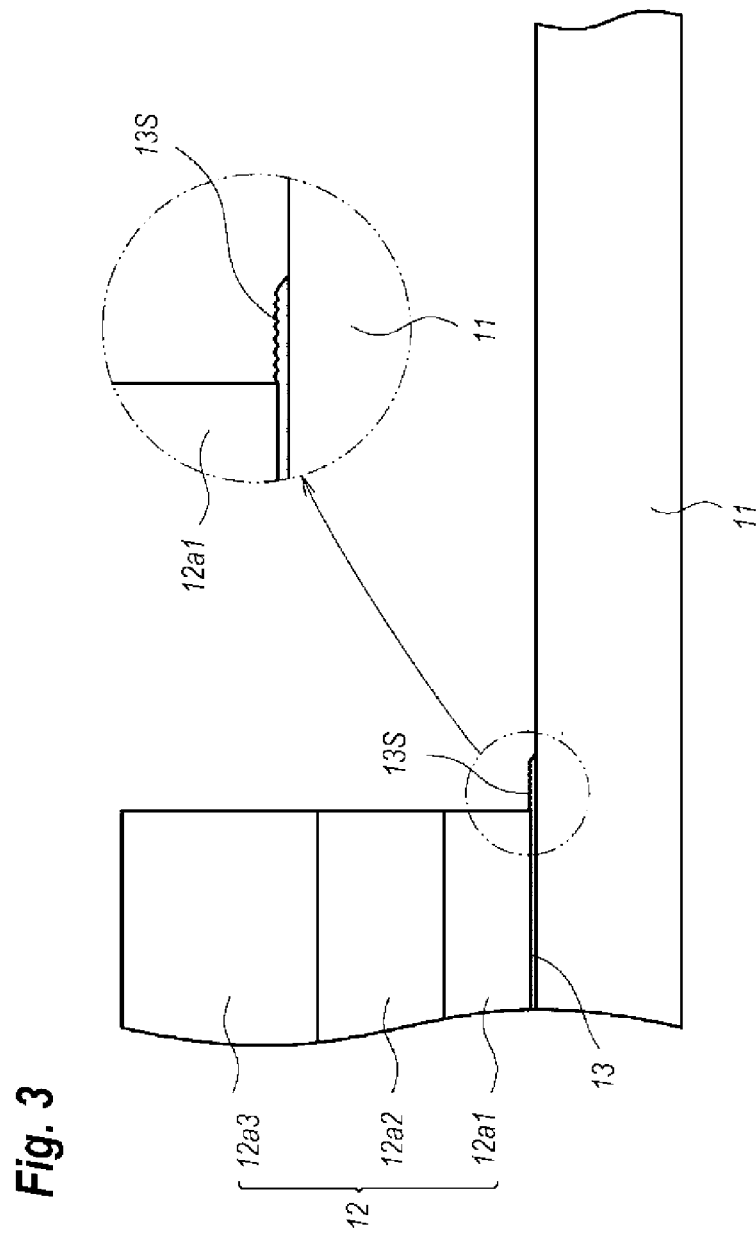
FIG. 3 is a cross section showing a status where excess solder oozes out from a gap between the ceramic layer and the base and spreads on the top of the base.

The side wall 12 may be formed by sintering respective ceramic layers, 12a1 to 12a6. The side wall 12 is fixed to the base 11 made of CuW with solder type of silver copper (AgCu) 13, while the respective ceramic layers, 12a1 to 12a6, may be also sintered using AgCu solder. In order to get reliable sintering, an enough amount of AgCu solder is preferably to be applied between the ceramic layers and between the side wall 12 and the base 11. Insufficient amount of AgCu solder possibly leaves voids in the solidified solder. FIG. 3 is a cross section showing a status where excess solder 13S oozes out from a gap between the lowest ceramic layer 12a1 and the base 11 and spreads in the top surface of the base 11, where the spreading solder 13S causes a roughed surface thereof with an average roughness Ra becomes greater than 0.1 jam but smaller than 10 μm.

The optical transmitting module 1 of the present embodiment installs the driver 22 within the housing 2, where the driver 22 electrically drives the four LDs 61. Driving signals provided in RF terminals on the feedthrough enter the driver 22; carried on the interconnections, and reaches the driver 22. The driver 22 amplifies thus provided driving signals and drives the LDs 61 with the amplified driving signals. The LDs 61 in the present embodiment may be driven in, what is called, the shunt-driving mode. Specifically, in the shunt-driving mode, an LD and a transistor are connected in parallel with respect to an inductor. A bias current externally provided through the inductor is switched between the LD and the transistor by turning on/off the transistor. The bias current flows in the LD when the transistor turns off, while, flows in the transistor when the transistor turns on. Thus, the inductor is inevitable to have substantial inductance in the shunt-mode driving, which makes the inductor bigger.

The optical transmitting module 1 of the present embodiment installs the inductors 53, whose counts is same with the number of the LDs 61, on the driver 22 through a spacer 51 and a carrier 52. The spacer 51 may be made of silicon (Si) or aluminum nitride (AlN), while the carrier 52 is made of silicon di-oxide ($SiO_2$) with relatively smaller dielectric constant in order to reduce parasitic capacitance between the inductors 53 and the driver 22. The carrier 52 provides interconnections 52L on a top surface thereof, where the interconnections 52L are electrically isolated from each other. The bias currents supplied to the DC terminals are provided to the interconnections 52L through bonding wires 41, which are omitted in FIG. 1; pass the inductors 53, provided to an LD carrier 35 that mounts the LDs 61 through other bonding wires 42; and finally provided to the LDs 61.

The TEC 32 provides a bottom plate 32a, a plurality of Peltier elements 32b, and a top plate 32c, where the bottom and top plates, 32a and 32c, sandwich the Peltier elements 32b. The TEC 32 mounts the LD carrier 35 thereon through a substrate 34. The substrate 34 mounts, in addition to the LD carrier 35, a plurality of lenses 62 and some optical components thereon. The carrier 21 and the LD carrier 35 are preferably made of aluminum nitride (AlN) from a viewpoint of good thermal conductivity. The carrier 21, which has a plane cross section of a rectangle, provides a rectangular top surface whose dimensions are substantially equal to a plane size of the driver 22.

The driver 22 provides an input pad 22P and an output pad 23P where the former pad 22P is arranged along an edge facing the top surface of the third ceramic layer 12a3; while the latter pad 23P is arranged along another edge facing the LD carrier 35. The input pad 22P is connected to the interconnections 12L provided on the top surface of the third ceramic layer 12a3 with bonding wires 41, where the input pad 22P has a level substantially equal to or slightly higher than a level of the top surface of the third ceramic layer 12a3. The output pad 23P is wire-bonded with the interconnections 35L provided on the top surface of the LD carrier 35 with bonding wires 42, where the output pad 23P in a level thereof is substantially equal to or slightly higher than a level of the interconnections 35L on the LD carrier 35.

In order to drive the LDs 61 in high speed, the bonding wires, 41 and 42, in lengths thereof are preferably set to be shorter as possible. The optical transmitting module 1 of the present embodiment places the carrier 21 as close as possible to the feedthrough, namely, the side wall 12. However, the base 11 leaves the excess AgCu solder in an area next to the lower ceramic layer 12a1. Moreover, eutectic alloy type of gold-tin (AuSn) for fixing the carrier 21 onto the base 11 possibly oozes out from a gap between the base 11 and carrier 21 and spreads on the surface of the base 11. Such excess AgCu solder and excess eutectic AuSn alloy spreading on the surface of the base 11 may prevent the carrier 21 from being mounted on the base 11 enough close to the side wall 12. The optical transmission module 1 of the present embodiment, in order to mount the carrier 21 enough close to the side wall 12, cuts a bottom corner of the carrier 21 facing the side wall 12 to form a chamfered corner 21a. The chamfered corner 21a may provide a room to receive excess solder oozing out from the gap between the carrier 21 and the base 11, and effectively prevent solder balls, which will be described later in the present specification, from being formed.

The carrier 21 of the present embodiment also provides other chamfered corners 21b in the top surface thereof where the driver 22 is mounted thereon. The chamfered corners 21b may form rooms to receive excess solder 24 for mounting the driver 22 onto the top surface of the carrier 21. The solder 24 for the driver 22 preferably has a melting point that is lower than that of eutectic AuSn alloy for fixing the carrier 21 onto the base 11. Furthermore, the TEC 32 in the bottom plate 32a thereof provides a chamfered corner 31a facing the carrier 21; and the substrate 34 also provides a chamfered corner 34a facing the carrier 21, where the LD carrier 35 is mounted on an area of the substrate 34 including the chamfered corner 34a, that is the LD carrier 35 covers the chamfered corner 34a. Such chamfered corners, 31a and 34a, may also form rooms to absorb or receive the excess solder and effectively prevent the solder balls from being formed.

Figure 4:
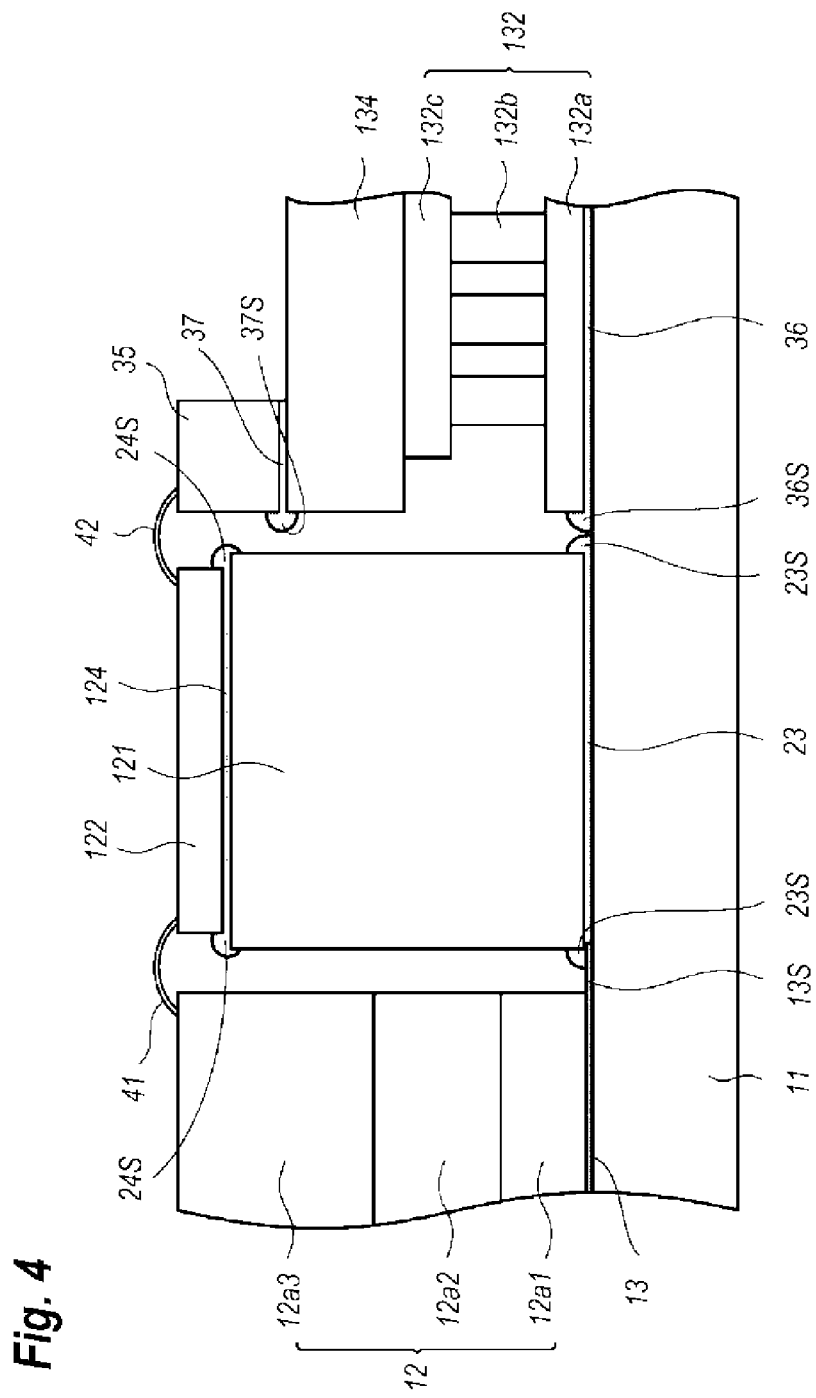
FIG. 4 shows a cross section of a primary portion around a conventional carrier without chamfered corners, a TEC, and a substrate also without chamfered corners.

FIG. 4 shows a cross section of a primary portion around a conventional carrier 121, a TEC 132, and a substrate 134, where those components are comparable to the carrier 21, the TEC 32, and the substrate 34 of the present embodiment. The conventional carrier 121, the conventional TEC 132 in the bottom plate 132a thereof, and the conventional substrate 134 has no chamfered corners. FIG. 5A and FIG. 5B show processes of mounting the conventional carrier 121 onto the base 11; and FIG. 6A and FIG. 6B show processes of mounting the carrier 21 of the embodiment onto the base 11.

As described, the base 11 in an area closer to the side wall 12 leaves the excess solder 13S oozing out from the gap between the side wall 12 and the base 11, where the excess solder 13S causes a roughed surface. Mounting the carrier 21 on the base 11 closer to the side wall 12, the carrier 21 is necessary to be placed on this roughed surface of the oozing solder 13S, which inevitably requires that the solder 23 is applied thick to compensate the surface roughness of the oozing solder 13S and prevent voids from causing in the solder 23. Thus, further excess solder 23S oozes out from the gap between the carrier 121 and the base 11, and possibly forms solder balls 23S, as shown in FIG. 5B. Another components mounted closer to the carrier 121 is necessary to set a space for avoiding those solder balls 23S, which resultantly makes bonding wires longer.

Moreover, when the solder ball 23S reaches an area for mounting the TEC 132 and the TEC 132 is necessary to be mounted on the solder ball 23S, the TEC 132 does not secure not only the horizontal level of the top plate 132c thereof and the substrate 134 on the top plate 132c but heat transfer between the bottom plate 132a and the base 11. The bottom plate 132a is occasionally broken during the assembly of the TEC 132.

Accordingly, the carrier 21 of the present embodiment provides the chamfered corners 21a facing the base 11 to form rooms 26 for receiving the excess solder 23. The rooms 26 may effectively prevent the solder ball 23S from being caused. The carrier 21 provides a metal film 25 in the bottom surface thereof including the chamfered corners 21a. The carrier 21 also provides another metal film on the top surface thereof including the chamfered corners 21b, which is not illustrated in the figures.

When the top surface of the carrier 121 provides no chamfered corners, excess solder oozing out from the gap between the driver 122 and the carrier 121 may cause solder balls. Similarly, the substrate 134 without chamfered corners possibly causes solder balls 37S derived from excess solder 37 oozing out from the gap between the substrate 134 and the LD carrier 35.

The solder balls, 24S and/or 37S, should be avoided to be touched to any components. In particular, when the LDs 61 are driven in the shunt driving mode, anodes and cathodes of the LDs 61 are preferably connected with transistors implemented in the driver 22 directly through shortest paths without being grounded within the housing 2. When the LDs 61 in respective cathodes thereof are grounded within the housing, a cross-talk between the LDs 61 increases due to interference through the ground. On the other hand, mounting the TEC 132 or the substrate 134 so as to secure an enough space for avoiding solder balls, 24S and 37S, from touching other components, which makes bonding wires 42 connecting the driver 22 with the LD carrier 35 longer and high frequency signals carried on the bonding wires 42 degrade quality thereof. The chamfered corners, 21b and 34a, provided in the top of the carrier 21 and the top of the substrate 34, respectively, may form rooms for receiving excess solder and enables the TEC 32 or the substrate 34 to be placed closer to the driver 22.

Figure 7A:
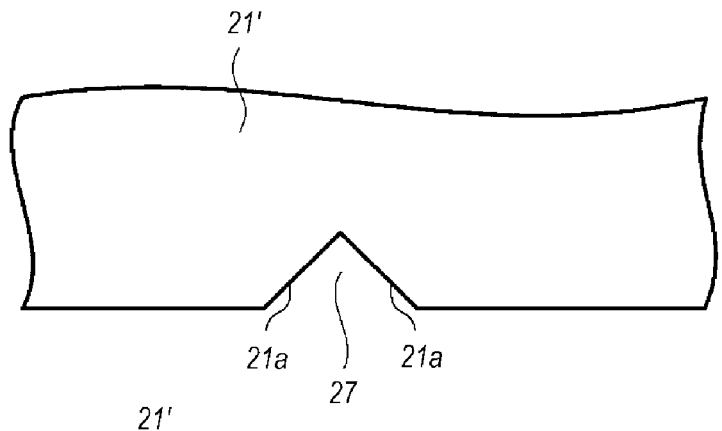
FIG. 7A to FIG. 7C show processes of forming the carrier.
Figure 7B:
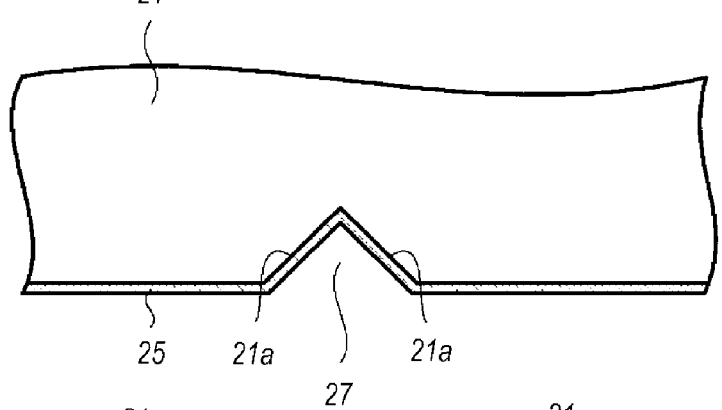
Figure 7C:
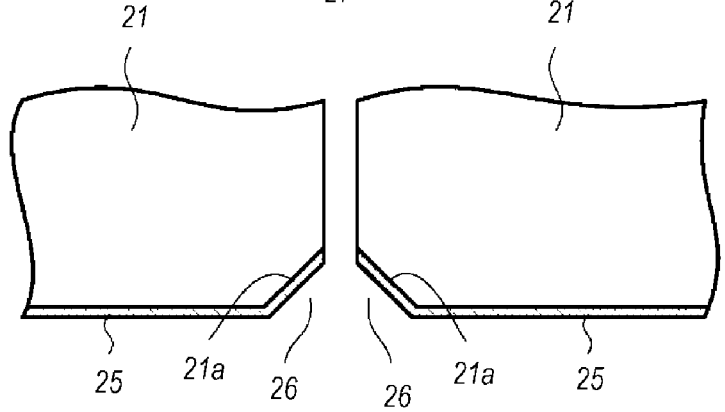

Next, a process of forming the carrier 21 with chamfered corners will be described. FIG. 7A to FIG. 7C show processes of forming the carrier 21. First, the process forms V-shaped grooves lengthwise and crosswise on a surface of a raw substrate 21', which may be made of ceramics such as aluminum nitride (AlN), aluminum oxide ($Al_2O_3$), and so on. An area surrounded by the V-shaped grooves corresponds to the plane size of the carrier 21. The V-shaped groove has two slant surfaces making respective angles of substantially 45° against the surface of the raw substrate 21', and a depth of 0.1±0.05 mm, which means that the room formed by the chamfered corner, 21a and 21b, has a depth of 0.1±0.05 mm. The carrier 21 may have a plane cross section substantially equal to a plane size of the driver 22 and a height or thickness such that a total thickness of the carrier 21 and the driver 22 becomes substantially equal to or slightly smaller than a total thickness of lower three ceramic layers, 12a1 to 12a3. That is, the thickness or the height of the carrier 21 is preferably set such that the top level of the driver 22, which depends on thicknesses of the solder 23, the carrier 21, the solder 24, and the driver 22, becomes substantially equal to the top level of the third side wall 12a3.

Then, the raw substrate 21' is to be coated with a metal film 25 that stacks titanium (Ti), platinum (Pt), and gold (Au) with thicknesses of 0.1, 0.2 and 0.5 μm, respectively. A vacuum evaporation may deposit the stacked metal film 25. If necessary, eutectic solder type of AuSn with a thickness of 10 μm covered with an Au film with a thickness of 0.15 μm may be formed on the stacked metal film 25 through another Pt film with a thickness of 0.5 μm.

Then, the raw substrate 21' is cut along the V-shaped grooves 27 with a blade whose thickness is thinner than a width of the V-shaped grooves. Specifically, attaching a tape to a surface of the raw substrate 21' opposite to a surface providing the V-shaped grooves 27, where the tape is a type of an expanding tape used in a dicing of an ordinary semiconductor process; cutting the raw substrate 21' along the V-shaped grooves 27; and expanding the tape; the raw substrate 21' may be divided into respective carriers 21. The carrier 21 thus formed provides the chamfered corners in respective edges surrounding the top surface thereof. For the chamfered corners 21b provided in the top surface of the carrier 21, the V-shaped grooves 27 are formed in both surfaces of the raw substrate 21'. Positional alignment of the V-shaped grooves 27 in the respective surfaces may be carried out by selecting two edges of the raw substrate 21' as references.

Figure 8A:
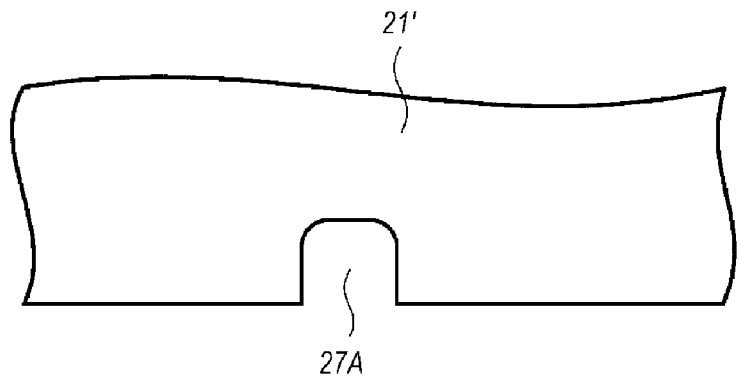
FIG. 8A to FIG. 8C show processes of forming another carrier having a room different from that derived from the chamfered corner.
Figure 8B:
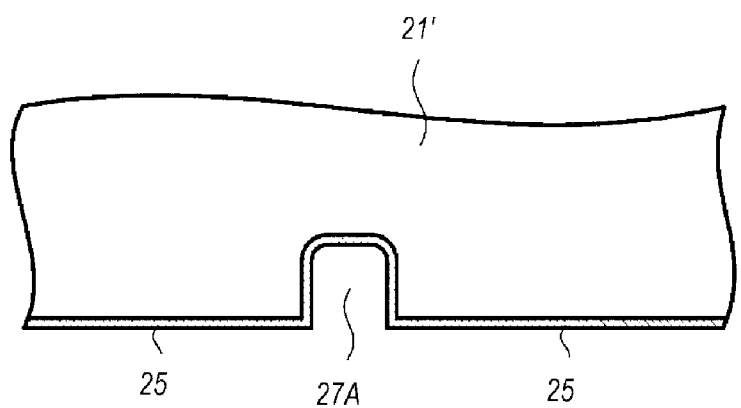
Figure 8C:
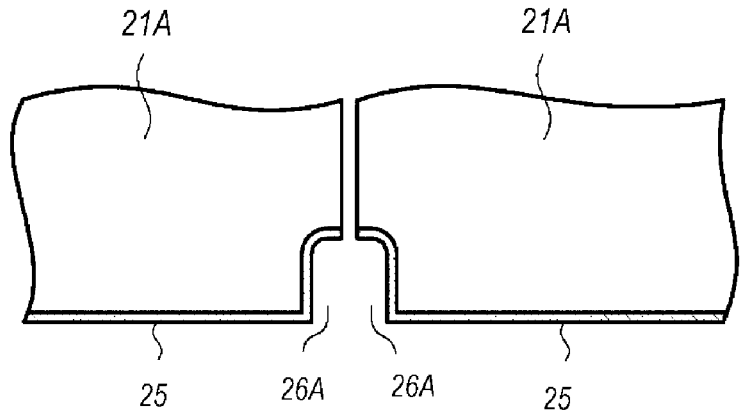

The rooms for receiving the excess solder described above may be formed by the chamfered corners. However, the rooms are not restricted in shaped derived from the chamfered corners; a space to receive the excess solder is only a function requested to the room. FIG. 8A to FIG. 8C show processes of forming the carrier 21A with another type of a room 26A different from that derived from the chamfered corner. The room 26A shown in FIG. 8A to FIG. 8C is derived from U-shaped grooves 27A. Also, the stacked metal film 25 may be formed by sputtering because the U-shaped grooves have two steep sides to which metals are hard to be deposited by the vacuum evaporation. The sputtering may deposit metals on such a steep side with enough thicknesses. Other processes are substantially similar to those described above. A rectangular cross section of the grooves, instead of the V-shape and/or the U-shape is applicable as the grooves.

The embodiment thus described concentrates on an arrangement where the carrier 21 is mounted closer to the side wall 12. However, the carrier 21 with the rooms 26 for receiving the excess solder is not restricted to those arrangements. The carrier 21 of the embodiment may be applicable to another arrangement where the carrier 21 is mounted closer to another carrier that may mount other electrical and/or optical components. In such an arrangement, the two carriers may be disposed close enough as long as at least one of the carriers provides the room to receive the excess solder.

In the foregoing detailed description, the optical transmitting module of the present invention has been described with reference to specific exemplary embodiments thereof. However, it will be evident that various modifications and changes may be made thereto without departing from the broader spirit and scope of the present invention. For instance, the description above concentrates on an optical transmitting module implementing one or more LDs; but the carrier of the embodiment may be implemented within an optical receiving module that provides one or more photodiodes and circuits mounted on the carrier. Accordingly, the present specification and figures are accordingly to be regarded as illustrative rather than restrictive.

What is claimed is:

1. An optical module, comprising:
   at least one semiconductor optical device;
   a carrier that mounts a component that couples with the semiconductor optical device;
   a housing including a side wall made of ceramics and a base made of metal, the side wall and the base forming a space for enclosing the semiconductor optical device, the carrier and the component therein; and
   eutectic alloy for fixing the carrier onto the base,
   wherein the carrier provides a room in a corner facing the base and the side wall, the room receiving excess eutectic alloy oozing out from a gap between the carrier and the base,
   wherein the room in the carrier is formed by a chamfered corner,
   wherein the carrier is coated with a metal film on a surface facing and attaching to the base including the chamfered corner,
   wherein the metal film stacks metal layers respectively composed of different materials, and
   wherein the eutectic alloy is provided between the metal film and the base.

2. The optical module according to claim 1, wherein the room has a depth of 0.1±0.05 mm.

3. The optical module according to claim 1, wherein the eutectic alloy for fixing the carrier is a type of eutectic solder of gold and tin (AuSn).

4. The optical module according to claim 1, wherein the side wall includes a plurality of ceramic layers each sintered by solder type of silver and copper (AgCu), and
   wherein the base has an area closer to the side wall where the AgCu solder spreads out oozing from a gap between the side wall and the base.

5. The optical module according to claim 4, wherein the AgCu solder spreading into the area closer to the side wall has average surface roughness of 0.1 to 10 µm.

6. The optical module according to claim 1, wherein the component is mounted on the carrier with another eutectic alloy containing gold and tin (AuSn), and
   wherein the carrier provides other rooms that receives another excess eutectic alloy oozing out from a gap between the carrier and the component.

7. The optical module according to claim 6, wherein the carrier provides chamfered corners in a top surface thereof that form the other rooms, and
   wherein the component covers the other rooms.

8. The optical module according to claim 6, wherein the other rooms have a depth of 0.1±0.05 mm.

9. The optical module according to claim 1, wherein the component has a plane size substantially equal to a plane size of the carrier.

10. The optical module according to claim 1, wherein the at least one semiconductor optical device is a semiconductor laser diode (LD),
    wherein the optical module further includes a thermoelectric cooler (TEC), a substrate, and an LD carrier; the TEC being mounted on the base next to the carrier using an AuSn eutectic alloy, the substrate being mounted on the TEC, the LD carrier being mounted on the substrate using solder having a melting point lower than a melting point of the AuSn eutectic alloy that fixes the TEC onto the base, the LD being mounted on the LD carrier, and
    wherein the TEC includes a bottom plate, a top plate and a plurality of Peltier elements put between the bottom plate and the top plate, the bottom plate having a chamfered corner facing the carrier, the chamfered corner of the bottom plate receiving excess AuSn eutectic alloy for fixing the TEC onto the base.

11. The optical module according to claim 10, wherein the substrate provides a chamfered corner facing the carrier, the chamfered corner in the substrate facing the carrier and being covered with the LD carrier.

12. An optical module, comprising:
    at least one semiconductor optical device;
    a carrier that mounts a component that couples with the semiconductor optical device;
    a housing including a side wall made of ceramics and a base made of metal, the side wall and the base forming a space for enclosing the semiconductor optical device, the carrier and the component therein; and
    eutectic alloy for fixing the carrier onto the base,
    wherein the carrier provides a room in a corner facing the base and the side wall, the room receiving excess eutectic alloy oozing out from a gap between the carrier and the base,
    wherein the side wall includes a plurality of ceramic layers each sintered by solder type of silver and copper (AgCu), and
    wherein the base has an area closer to the side wall where the AgCu solder spreads out oozing from a gap between the side wall and the base.

13. An optical module, comprising:
    at least one semiconductor optical device;
    a carrier that mounts a component that couples with the semiconductor optical device;
    a housing including a side wall made of ceramics and a base made of metal, the side wall and the base forming a space for enclosing the semiconductor optical device, the carrier and the component therein; and
    eutectic alloy for fixing the carrier onto the base,
    wherein the carrier provides a room in a corner facing the base and the side wall, the room receiving excess eutectic alloy oozing out from a gap between the carrier and the base,
    wherein the component is mounted on the carrier with another eutectic alloy containing gold and tin (AuSn), and
    wherein the carrier provides other rooms that receives another excess eutectic alloy oozing out from a gap between the carrier and the component.

* * * * *